(12) United States Patent
Li et al.

(10) Patent No.: US 11,778,886 B2
(45) Date of Patent: Oct. 3, 2023

(54) DISPLAY SUBSTRATE AND PREPARATION METHOD THEREOF, AND DISPLAY APPARATUS

(71) Applicants: Chongqing BOE Display Technology Co., Ltd., Chongqing (CN); BOE Technology Group Co., Ltd., Beijing (CN)

(72) Inventors: Xu Li, Beijing (CN); Dawei Shi, Beijing (CN); Lu Yang, Beijing (CN); Wentao Wang, Beijing (CN); Cenhong Duan, Beijing (CN); Can Huang, Beijing (CN); Bangwei Wu, Beijing (CN); Pei Wang, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 447 days.

(21) Appl. No.: 16/934,040

(22) Filed: Jul. 21, 2020

(65) Prior Publication Data
US 2021/0074778 A1 Mar. 11, 2021

(30) Foreign Application Priority Data
Sep. 11, 2019 (CN) .......................... 201910859632.6

(51) Int. Cl.
*H10K 59/50* (2023.01)
*G02F 1/16766* (2019.01)
(Continued)

(52) U.S. Cl.
CPC ............ *H10K 59/50* (2023.02); *G02F 1/167* (2013.01); *G02F 1/1676* (2019.01);
(Continued)

(58) Field of Classification Search
None
See application file for complete search history.

(56) References Cited

U.S. PATENT DOCUMENTS

2008/0211734 A1  9/2008  Huitema et al.
2011/0003430 A1* 1/2011  Yamazaki ........... H01L 29/7869
                                                        438/104
(Continued)

FOREIGN PATENT DOCUMENTS

CN    101199209 A    6/2008
CN    102651383 A    8/2012
(Continued)

OTHER PUBLICATIONS

Office Action dated May 28, 2021 for Chinese Patent Application No. 201910859632.6 and English Translation.
Office Action dated Sep. 23, 2021 for Chinese Patent Application No. 201910859632.6 and English Translation.
Office Action dated Dec. 6, 2021 for Chinese Patent Application No. 201910859632.6 and English Translation.

*Primary Examiner* — Ashok Patel
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a first display region and a second display region within the first display region, wherein the first display region includes a plurality of emitting units, and the second display region includes a plurality of electrophoretic units, the plurality of emitting units are configured to realize display, and the plurality of electrophoretic units are configured to realize switch between a display state and a transparent state.

10 Claims, 9 Drawing Sheets

(51) Int. Cl.
  *G02F 1/1677*  (2019.01)
  *G02F 1/167*   (2019.01)
  *G02F 1/16756* (2019.01)
  *H10K 59/122*  (2023.01)
  *H10K 59/12*   (2023.01)
  *G02F 1/1676*  (2019.01)

(52) U.S. Cl.
  CPC ........ *G02F 1/1677* (2019.01); *G02F 1/16756* (2019.01); *G02F 1/16766* (2019.01); *H10K 59/122* (2023.02); *G02F 2201/44* (2013.01); *H10K 59/1201* (2023.02)

(56) References Cited

U.S. PATENT DOCUMENTS

| | | | |
|---|---|---|---|
| 2012/0218242 A1 | 8/2012 | Ho et al. |
| 2014/0374716 A1 | 12/2014 | Kim et al. |
| 2015/0236082 A1 | 8/2015 | Wang et al. |

FOREIGN PATENT DOCUMENTS

| | | |
|---|---|---|
| CN | 102890906 A | 1/2013 |
| CN | 103886813 A | 6/2014 |
| CN | 104241327 A | 12/2014 |
| CN | 110049163 A | 7/2019 |
| CN | 110071125 A | 7/2019 |
| KR | 10-2019-0081100 A | 7/2019 |

\* cited by examiner

DISPLAY SUBSTRATE AND PREPARATION METHOD THEREOF, AND DISPLAY APPARATUS

CROSS-REFERENCE TO RELATED APPLICATION

The present application claims the priority of Chinese Patent Application No. 201910859632.6 filed to the CNIPA on Sep. 11, 2019, the content of which is hereby incorporated by reference.

TECHNICAL FIELD

The present disclosure relates to, but is not limited to the technical field of display, specifically to a display substrate and a preparation method thereof, and a display apparatus.

BACKGROUND

An Organic Light Emitting Diode (OLED) is an active light emitting display device, which has advantages of ultra-thin thickness, large viewing angle, high brightness, low cost, fast response speed, low power consumption, wide operating temperature range and flexible display. The OLED has gradually become a next generation of display technology with great development prospects. OLEDs are increasingly applied in various display apparatuses, especially in intelligent terminal products such as mobile phones and tablet computers.

SUMMARY

The following is a summary of the subject matter described in detail herein. This summary is not intended to limit the scope of protection of the claims.

Provided is a display substrate, including a first display region and a second display region within the first display region, wherein the first display region includes a plurality of emitting units, and the second display region includes a plurality of electrophoretic units, the plurality of emitting units are configured to realize display, and the plurality of electrophoretic units are configured to realize switch between a display state and a transparent state.

In some possible implementations, each of the plurality of emitting units includes a first driving structure layer and an emitting structure layer which are stacked on a substrate, and each of the plurality of electrophoretic units includes a second driving structure layer and an electrophoretic structure layer which are stacked on the substrate.

In some possible implementations, the first driving structure layer includes a plurality of first thin film transistors, each of the plurality of first thin film transistors includes a first active layer, a first gate electrode, a first source electrode and a first drain electrode; the second driving structure layer includes a plurality of second thin film transistors, each of the plurality of second thin film transistors includes a second active layer, a second gate electrode, a second source electrode, and a second drain electrode; the first active layer and the second active layer are arranged on a same layer; the first gate electrode and the second gate electrode are arranged on a same layer; and the first source electrode, the first drain electrode, the second source electrode and the second drain electrode are arranged on a same layer.

In some possible implementations, the emitting structure layer includes a first anode, an organic emitting layer, and a first cathode; the electrophoretic structure layer includes a second anode, an electrophoretic display layer and a second cathode; the first anode and the second anode are arranged on a same layer; and the first cathode and the second cathode are arranged on a same layer.

In some possible implementations, the organic emitting layer includes a first pixel defining layer provided with an opening region, and an organic emitting material layer arranged within the opening region; and the electrophoretic display layer includes a second pixel defining layer provided with a groove, and an electrophoretic display material layer arranged within the groove.

In some possible implementations, the electrophoretic display material layer includes a transparent dispersion and dyed conductive particles arranged in the dispersion.

In some possible implementations, the first pixel defining layer and the second pixel defining layer are arranged on a same layer.

In some possible implementations, a cross-sectional shape of the groove is an inverted trapezoid shape, and a width of a near end of the groove close to the second anode is smaller than a width of a remote end of the groove away from the second anode.

In some possible implementations, a depth of the groove is less than or equal to a thickness of the second pixel defining layer.

Provided is a display apparatus including the display substrate abovementioned.

Provided is a preparation method of a display substrate. The display substrate includes a first display region and a second display region within the first display region, and the preparation method includes: forming a plurality of emitting units in the first display region, and forming a plurality of electrophoretic units in the second display region, wherein the plurality of emitting units are configured to realize display, and the plurality of electrophoretic units are configured to realize switch between a display state and a transparent state.

In some possible implementations, forming the plurality of emitting units in the first display region and forming the plurality of electrophoretic units in the second display region includes: forming synchronously first driving structure layers and second driving structure layers on a substrate; and forming synchronously emitting structure layers and electrophoretic structure layers; wherein each emitting structure layer is formed on each first driving structure layer, and the each first driving structure layer and the each emitting structure layer form an emitting unit realizing display; and each electrophoretic structure layer is formed on each second driving structure layer, and the each second driving structure layer and the each electrophoretic structure layer form an electrophoretic unit realizing switching between the display state and the transparent state.

In some possible implementations, forming synchronously the first driving structure layers and the second driving structure layers on the substrate includes: forming first active layers and second active layers on the substrate, wherein the first active layers are in the first display region and the second active layers are in the second display region; forming a first insulating layer, and forming first gate electrodes and second gate electrodes on the first insulating layer, wherein the first gate electrodes are in the first display region and the second gate electrodes are in the second display region; forming a second insulating layer and a third insulating layer, wherein first vias exposing each first active layer and each second active layer respectively and second vias exposing each first gate electrode and each second gate electrode respectively are formed on the third insulating layer; forming first source electrodes, first drain electrodes, first connection electrodes, second source electrodes, second drain electrodes and second connection electrodes on the third insulating layer, wherein each first source electrode and each first drain electrode are respectively connected with a first active layer through first vias, each first connection electrode is connected with a first gate electrode through a second via, each second source electrode and each second drain electrode are respectively connected with a second active layer through first vias, and each second connection electrode is connected with each second gate electrode through a second via; and forming a fourth insulating layer, wherein third vias exposing the first drain electrodes and the second drain electrodes respectively are formed on the fourth insulating layer.

In some possible implementations, forming synchronously the emitting structure layers and the electrophoretic structure layers includes: forming first anodes and second anodes on the fourth insulating layer, wherein each first anode and each second anode are respectively connected with a first drain electrode and a second drain electrode through third vias; forming organic emitting layers in the first display region, and forming electrophoretic display layers in the second display region; and forming first cathodes and second cathodes, wherein the first cathodes are in the first display region and the second cathodes are in the second display region.

In some possible implementations, forming the organic emitting layers in the first display region, and forming the electrophoretic display layers in the second display region includes: forming first pixel defining layers and second pixel defining layers, wherein the first pixel defining layers are in the first display region, opening regions exposing the first anodes are formed on the first pixel defining layers, the second pixel defining layers are in the second display region, and grooves are formed on the second pixel defining layers; and forming organic emitting material layers within the opening regions, and forming the electrophoretic display material layers within the grooves.

In some possible implementations, a depth of each groove is less than or equal to a thickness of each second pixel defining layer.

In some possible implementations, a cross-sectional shape of each groove is an inverted trapezoid shape, and a width of a near end of the groove close to a second anode is smaller than a width of a remote end of the groove away from the second anode; and each electrophoretic display material layer includes a transparent dispersion and dyed conductive particles arranged in the dispersion.

In some possible implementations, forming the organic emitting layers in the first display region, and forming the electrophoretic display layers in the second display region includes: forming first pixel defining layers in the first display region, wherein opening regions exposing the first anodes are formed on the first pixel defining layers; forming organic emitting material layers are formed in the opening regions; and pasting pre-prepared electrophoretic display layers on the second display region, wherein the electrophoretic display layers include second pixel defining layers formed with grooves, and electrophoretic display material layers arranged within the grooves.

In some possible implementations, a depth of each groove is less than or equal to a thickness of each second pixel defining layer.

In some possible implementations, a cross-sectional shape of each groove is an inverted trapezoid shape, and a width of a near end of the groove close to a second anode is smaller than a width of a remote end of the groove away from the second anode; and each electrophoretic display material layer includes a transparent dispersion and dyed conductive particles arranged in the dispersion, and colors of dyed conductive particles include white, black, red, green or blue.

Other aspects will become apparent upon reading and understanding the drawings and detailed description.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solutions of the present disclosure and do not constitute a limitation on the technical solutions of the present disclosure. The shapes and dimensions of the components in the drawings do not reflect real proportions, and are only for the purpose of schematically illustrating the present disclosure.

Figure 1:
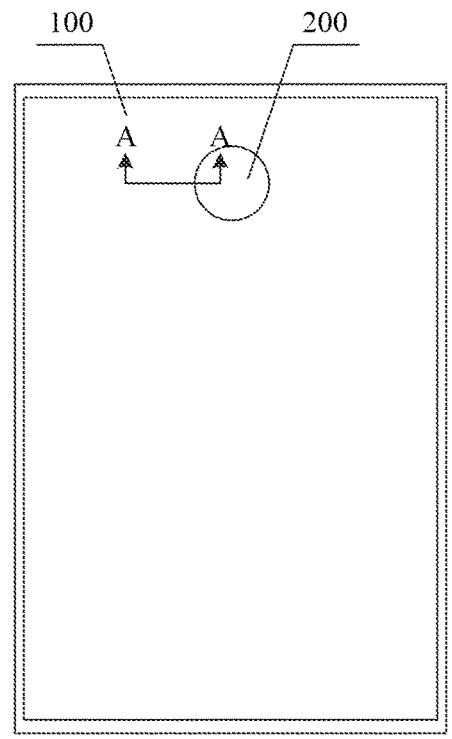
FIG. 1 is a schematic structural diagram of a display substrate according to an exemplary embodiment of the present disclosure.

Reference signs in the drawings are explained below.
- 10—Substrate;
- 11—Buffer layer;
- 12—First insulating layer;
- 13—Second insulating layer;
- 14—Third insulating layer;
- 15—Fourth insulating layer;
- 16—First inorganic layer;
- 17—Organic layer;
- 18—Second inorganic layer;
- 102—First active layer;
- 103—First gate electrode;
- 104—First capacitor electrode;
- 105—First source electrode;
- 106—First drain electrode;
- 107—First connection electrode;
- 202—Second active layer;
- 203—Second gate electrode;
- 204—Second capacitor electrode;
- 205—Second source electrode;
- 206—Second drain electrode;
- 207—Second connection electrode;
- 301—First anode;
- 302—First pixel defining layer;
- 303—Organic emitting material layer;
- 304—First cathode;
- 401—Second anode;
- 402—Second pixel defining layer;
- 403—Electrophoretic display material layer;
- 404—Second cathode;
- 500—Dyed conductive particles.

DETAILED DESCRIPTION

The embodiments herein may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments in the present disclosure and the features in the embodiments may be combined with each other arbitrarily if there is no conflict.

For intelligent terminal products, most manufacturers are pursuing a higher screen-to-body ratio, such as a full screen and a borderless screen, so as to bring more dazzling visual impact to users. For products such as intelligent terminals, it is necessary to arrange front-mounted cameras, optical sensors and other hardware. In order to increase the screen-to-body ratio, one technology is to open a hole on the screen and hide the hardware, such as the front-mounted camera, under the OLED screen. Although such manner of opening can realize a larger display region, in order to ensure a shooting function of the camera, the opening region has to ensure a higher transmittance, so the pixels in the opening region cannot display images, and the truly full screen display is not realized. Such manner of opening also increases design difficulty and manufacturing cost, and cannot ensure effectiveness and reliability of encapsulation.

Electrophoretic Display (EPD for short) is a new display technology based on the electrophoresis principle. It uses the principle of movement of conductive particles in an electric field, controls the movement of conductive particles through the electric field, thus realizing image display. There are three manners to realize three electrophoretic display, i.e., direct driving, passive matrix driving and active matrix driving. Compared with the direct driving and the passive matrix driving, active matrix driving technology can achieve better control, good information display, and has better advantages in high resolution and color display and the like. Display of high-end electronic paper mostly uses the active matrix driving technology. Thin Film Transistor (TFT) technology is a common active matrix driving technology. In an active driving matrix electrophoretic display panel, TFTs are integrated on a substrate to form a driver substrate, colloidal electrophoretic liquid is arranged on an electrophoretic substrate, the electrophoretic substrate and the driver substrate are combined to form a display panel. Electric signals of electrodes are controlled by the TFTs, so that charged particles in the colloidal electrophoretic liquid are shifted/gathered on a display surface, and images are formed by reflecting or absorbing external light. Since the electrophoretic display is bistable and does not need a backlight source, the image display can be maintained after the power supply is turned off, the electrophoretic display has characteristics of low power consumption, high contrast, good sunlight readability and the like.

The present disclosure provides a solution of display by integrating OLED and EPD, which can realize full screen display. In an exemplary embodiment, a display substrate includes a first display region and a second display region within the first display region, wherein the first display region includes a plurality of emitting units configured to realize display, and the second display region includes a plurality of electrophoretic units configured to realize switch between a display state and a transparent state.

According to the present disclosure, organic emitting display and electrophoretic display are well integrated, and a characteristic that the electrophoretic units can be switched between a display state and a transparent state is utilized, so that a full screen is realized, and the normal work of hardware such as a camera can be ensured. When the electrophoretic units are switched to the display state, the electrophoretic units and the emitting units provide image display together, further improving the screen-to-body ratio and realizing a truly full screen. When the electrophoretic units are switched to the transparent state, a transparent region formed by the electrophoretic units can provide a working window for hardware such as a camera and ensure the normal work of the hardware such as the camera.

In an exemplary embodiment, the display substrate further includes a plurality of gate lines and a plurality of data lines, wherein the plurality of gate lines and the plurality of data lines vertically intersect to define a plurality of display units arranged in a matrix. In the first display region, the display units are emitting units; in the second display region, the display units are electrophoretic units. The emitting units and the electrophoretic units in the same row share the same gate line; and the emitting units and the electrophoretic units in the same column share the same data line.

In an exemplary embodiment, an emitting unit includes a first driving structure layer and an emitting structure layer which are stacked on a substrate, and an electrophoretic unit includes a second driving structure layer and an electrophoretic structure layer which are stacked on the substrate, the first driving structure layer and the second driving structure layer are formed synchronously, and the emitting structure layer and the electrophoretic structure layer are formed synchronously.

In an exemplary embodiment, the first driving structure layer includes a plurality of first thin film transistors, each of the plurality of first thin film transistors includes a first active layer, a first gate electrode, a first source electrode and a first drain electrode; the second driving structure layer includes a plurality of second thin film transistors, each of the plurality of second thin film transistors includes a second active layer, a second gate electrode, a second source electrode, and a second drain electrode. The first active layer and the second active layer are arranged on the same layer and formed through the same patterning process; the first gate electrode and the second gate electrode are arranged on the same layer and are formed through the same patterning process; the first source electrode and the first drain electrode are arranged on the same layer as the second source electrode and the second drain electrode, and are formed through the same patterning process as the second source electrode and the second drain electrode.

In an exemplary embodiment, the emitting structure layer includes a first anode, an organic emitting layer, and a first cathode; the electrophoretic structure layer includes a second anode, an electrophoretic display layer and a second cathode; the first anode and the second anode are arranged on the same layer and are formed through the same patterning process; and the first cathode and the second cathode are arranged on the same layer and formed through the same patterning process.

In an exemplary embodiment, the organic emitting layer includes a first pixel defining layer provided with an opening region exposing the first anode, and an organic emitting material layer arranged within the opening region; and the electrophoretic display layer includes a second pixel defining layer provided with a groove, and an electrophoretic display material layer arranged within the groove.

In an exemplary embodiment, a shape of the groove is a frustum of a cone or frustum of a prism with a small lower base and a large upper base. On a plane perpendicular to the substrate, the cross-sectional shape of the groove is an inverted trapezoid shape, and a width of a near end of the inverted trapezoid close to the second anode (a lower base of the inverted trapezoid) is smaller than a width of a remote end of the inverted trapezoid away from the second anode (an upper base of the inverted trapezoid).

In an exemplary embodiment, a depth of the groove is equal to a thickness of the second pixel defining layer, and the groove exposes a second anode. Alternatively, the depth of the groove is smaller than the thickness of the second pixel defining layer, and the groove does not expose the second anode.

In an exemplary embodiment, the electrophoretic display material layer includes a transparent dispersion and dyed conductive particles arranged in the dispersion. Under action of an electric field formed by the second anode and the second cathode, when the dyed conductive particles move towards a side of the second cathode, the electrophoretic unit is in the display state, and when the dyed conductive particles move towards a side of the second anode, the electrophoretic unit is in the transparent state.

In an exemplary embodiment, colors of the dyed conductive particles include any one or more of white, black, red, green, and blue.

Figure 2:
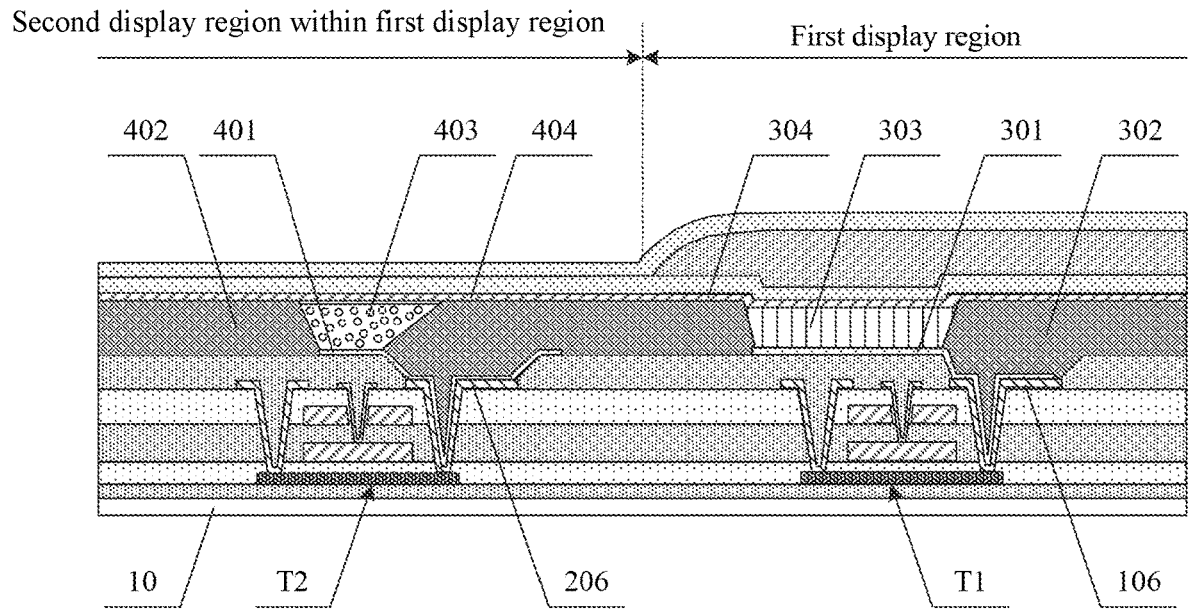
FIG. 2 is a sectional view taken along an A-A direction in FIG. 1.

FIG. 1 is a schematic diagram of structure of a display substrate according to an exemplary embodiment of the present disclosure, and FIG. 2 is a sectional view taken along an A-A direction in FIG. 1, and illustrates a display substrate with a top emission structure. As shown in FIG. 1, in an exemplary embodiment, on a plane parallel to the display substrate, the display substrate includes a first display region 100 and a second display region 200 within the first display region 100, the first display region 100 includes a plurality of emitting units distributed in an array, the plurality of emitting units are configured to realize display, the second display region includes a plurality of electrophoretic units distributed in an array, and the plurality of electrophoretic units are configured to realize switch between a display state and a transparent state. In an exemplary embodiment, a position of the second display region 200 within the first display region 100 is not limited, and may be located at an upper or lower portion of the first display region 100, or may be located at an edge of the first display region 100. In an exemplary embodiment, a shape of the second display region 200 is not limited, and may be circular as shown in FIG. 1, or may be oval, square, diamond, or any of other polygons.

In an exemplary embodiment, on a plane perpendicular to the display substrate, each emitting unit may include a first driving structure layer and an emitting structure layer, which are arranged on the substrate 10. The first driving structure layer may include a plurality of first thin film transistors T1, which may be 2T1C, 3T1C, or 4T1C design. FIG. 2 illustrates an example of only one emitting unit and one first thin film transistor. Each electrophoretic unit may include a second driving structure layer and an electrophoretic structure layer, which are arranged on the substrate 10. The second driving structure layer may include a plurality of second thin film transistors T2, which may be 2T1C design. FIG. 2 illustrates an example of only one display unit and one second thin film transistor. The first driving structure layer in the first display region 100 and the second driving structure layer in the second display region 200 may be synchronously prepared and formed, and the first thin film transistors T1 of the first driving structure layer and the second thin film transistors T2 of the second driving structure layer may share gate lines and data lines to realize progressive scanning to write display data.

In an exemplary embodiment, the first driving structure layer in the first display region 100 may include a first thin film transistor T1 arranged on the substrate 10, and the emitting structure layer may include a first anode 301 connected with a first drain electrode 106 of the first thin film transistor T1, and a first pixel defining layer 302, an organic emitting material layer 303, and a first cathode 304. The second driving structure layer in the second display region 200 may include a second thin film transistor T2 arranged on the substrate 10, and the electrophoretic structure layer may include a second anode 401 connected with a second drain electrode 206 of the second thin film transistor T2, and a second pixel defining layer 402, an electrophoretic display material layer 403, and a second cathode 404. In an exemplary embodiment, a structure of the second thin film transistor T2 and a structure of the first thin film transistor T1 may be the same, and may be synchronously prepared by the same process; the second anode 401 and the first anode 301 may be arranged on the same layer and may be formed by the same patterning process; the second pixel defining layer 402 and the first pixel defining layer 302 may be arranged on the same layer and may be formed by the same patterning process; the second cathode 404 and the first cathode 304 may be arranged on the same layer and may be formed by the same patterning process; and the second cathode 404 and the first cathode 304 may be an integral structure.

In an exemplary embodiment, the second pixel defining layer 402 is provided with a groove, and the groove may have a shape of a frustum of a cone or frustum of a prism with a large upper base and a small lower base on a plane parallel to the substrate. On a plane perpendicular to the substrate, the cross-sectional shape of the groove is an inverted trapezoid shape, and a width of a near end (a lower base of the inverted trapezoid) close to the second anode 401 is smaller than a width of a remote end (an upper base of the inverted trapezoid) away from the second anode 401. The electrophoretic display material layer 403 is arranged within the groove, and includes a transparent dispersion and dyed conductive particles arranged in the transparent dispersion. Under action of an electric field formed by the second anode 401 and the second cathode 404, the dyed conductive particles not only may move to a side of the second cathode 404 to enable the electrophoretic unit to display images, but also may move to a side of second anode 401 to enable the electrophoretic unit to form local transparency, thereby enabling the electrophoretic unit to be switched between the display state and the transparent state.

The following is an exemplary explanation through a preparation process of the display substrate. The "patterning process" mentioned in the present disclosure includes processinges, such as film layer deposition, coating of photoresist, mask exposure, development, etching, and stripping of photoresist. Deposition may be implemented by any one or more of sputtering, evaporation and chemical vapor deposition, coating may be implemented by any one or more of spraying and spin coating, and etching may be implemented by any one or more of dry etching and wet etching, and the present disclosure is not limited thereto. "Thin film" refers to a layer of thin film fabricated by a certain material on a base substrate using deposition or another process. If the "thin film" does not need a patterning process throughout the fabrication process, the "thin film" may also be referred to as a "layer". If the "thin film" needs a patterning process throughout the fabrication process, it is referred to as a "thin film" before the patterning process and as a "layer" after the patterning process. The "layer" that has undergone a patterning process includes at least one "pattern".

In an exemplary embodiment, the preparation process of the display substrate includes the following operations.

(1) Forming a Pattern of an Active Layer on a Substrate

Figure 3:
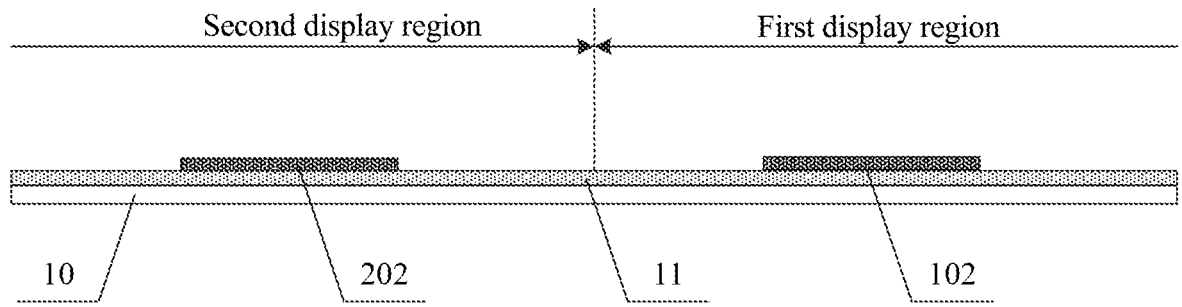
FIG. 3 is a schematic diagram of a display substrate after a pattern of an active layer is formed according to an exemplary embodiment of the present disclosure.

In an exemplary embodiment, forming the pattern of the active layer on the substrate may include the following acts: a buffer thin film is first deposited on the substrate 10 to form a pattern of a buffer layer 11 covering the entire substrate 10; subsequently, an active layer thin film is deposited, and the active layer thin film is patterned by a patterning process to form patterns of a first active layer 102 and a second active layer 202 arranged on the buffer layer 11, the first active layer 102 is formed in a first display region and the second active layer 202 is formed in a second display region, as shown in FIG. 3. In an exemplary embodiment, the substrate may be a flexible substrate made of a material such as polyimide (PI), polyethylene terephthalate (PET), or a surface-treated polymer soft film. The buffer thin film may be made of silicon nitride (SiNx), silicon oxide (SiOx), silicon oxynitride (SiON), or the like, and may be a single layer, a plurality of layers, or a composite layer. The active layer thin film may be made of various materials such as amorphous indium gallium zinc Oxide (a-IGZO), zinc oxynitride (ZnON), indium zinc tin oxide (IZTO), amorphous silicon (a-Si), polysilicon (p-Si), sexithiophene, polythiophene, that is, the present disclosure is simultaneously applicable to a Top Gate TFT-based display substrate manufactured through an oxide technology, a silicon technology and an organic technology.

(2) Forming a Pattern of a Gate Electrode

Figure 4:
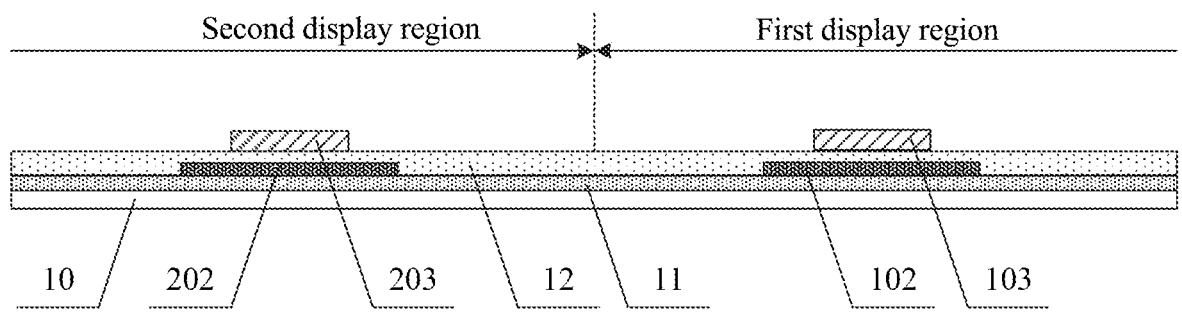
FIG. 4 is a schematic diagram of a display substrate after a pattern of a gate electrode is formed according to an exemplary embodiment of the present disclosure.

In an exemplary embodiment, forming the pattern of the gate electrode may include the following acts: a first insulating thin film and a first metal thin film are sequentially deposited on the substrate 10 where the above structure is formed, the first metal thin film is patterned by a patterning process to form a first insulating layer 12 covering the buffer layer 11, the first active layer 102 and the second active layer 202, and patterns of a first gate electrode 103, a second gate electrode 203 and a gate line (not shown) arranged on the first insulating layer 12, the first gate electrode 103 is formed in the first display region, and the second gate electrode 203 is formed in the second display region, and both the first gate electrode 103 and the second gate electrode 203 are connected with the gate line, as shown in FIG. 4. In an exemplary embodiment, the first insulating thin film may be made of silicon nitride (SiNx), silicon oxide (SiOx), silicon oxynitride (SiON), or the like, and may be a single layer, a plurality of layers, or a composite layer. In an exemplary embodiment, the first insulating layer 12 is referred to as a gate insulating (GI) layer. The first metal thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

(3) Forming a Pattern of a Capacitor Electrode

Figure 5:
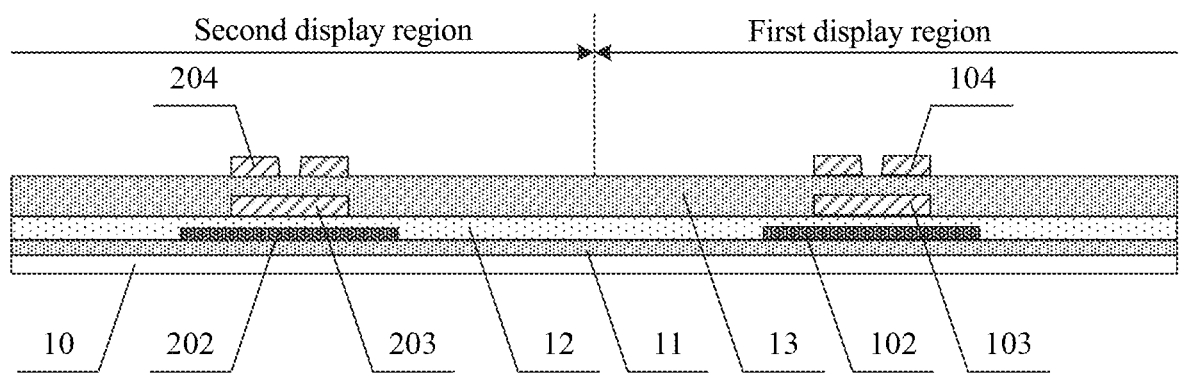
FIG. 5 is a schematic diagram of a display substrate after a pattern of a capacitor electrode is formed according to an exemplary embodiment of the present disclosure.

In an exemplary embodiment, forming the pattern of the capacitor electrode may include the following acts: a second insulating thin film and a second metal thin film are sequentially deposited on the substrate 10 where the above structure is formed, the second metal thin film is patterned by a patterning process to form a second insulating layer 13 covering the first insulating layer 12, the first gate electrode 103, the second gate electrode 203, and the gate line, and patterns of a first capacitor electrode 104 and a second capacitor electrode 204 arranged on the second insulating layer 13, the first capacitor electrode 104 is formed in the first display region, a position of the first capacitor electrode 104 corresponds to a position of the first gate electrode 103, the second capacitor electrode 204 is formed in the second display region, a position of the second capacitor electrode 204 corresponds to a position of the second gate electrode 203, and middle regions of the first capacitor electrode 104 and the second capacitor electrode 204 are etched away, as shown in FIG. 5. In an exemplary embodiment, the second insulating thin film may be made of silicon nitride (SiNx), silicon oxide (SiOx), silicon oxynitride (SiON), or the like, and may be a single layer, a plurality of layers, or a composite layer. In an exemplary embodiment, the second insulating layer 13 is referred to as a gate insulating (GI) layer. The second metal thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

(4) Forming a Pattern of a Third Insulating Layer

Figure 6:
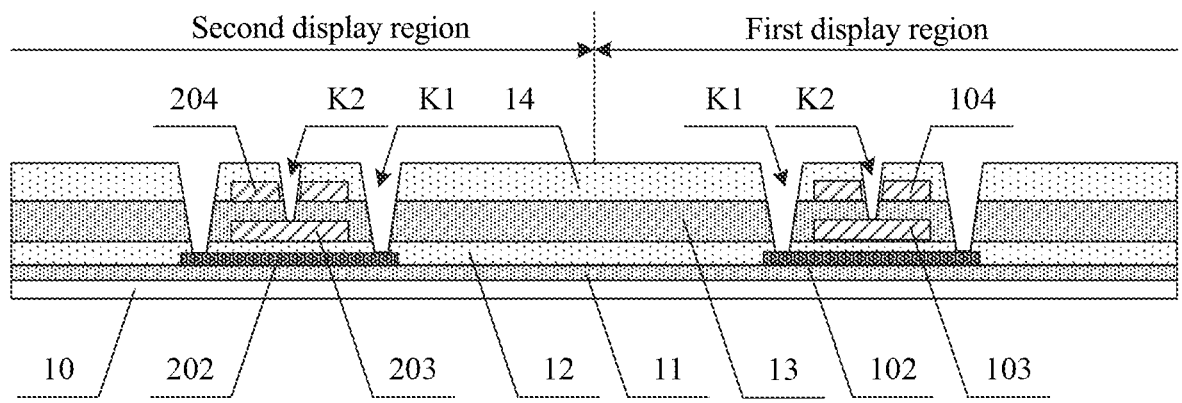
FIG. 6 is a schematic diagram of a display substrate after a pattern of a third insulating layer is formed according to an exemplary embodiment of the present disclosure.

In an exemplary embodiment, forming the pattern of the third insulating layer may include the following acts: a third insulating thin film is deposited on the substrate 10 where the above structure is formed, the third insulating thin film is patterned through a patterning process to form a pattern of a third insulating layer 14 with first vias K1 and second vias K2 in the first and second display regions, respectively, two first vias K1 provided in each display region are respectively at both ends of the active layer of each display region, the third insulating layer 14, the second insulating layer 13 and the first insulating layer 12 are etched away in the first vias K1 to expose surfaces of the first active layer 102 and the second active layer 202; one second via K2 provided in each display region is in a middle region of the capacitor electrode in each display region, the third insulating layer 14 and the second insulating layer 13 are etched away in the second vias K2 to expose surfaces of the first gate electrode 103 and the second gate electrode 203, as shown in FIG. 6. In an exemplary embodiment, the third insulating thin film may be made of silicon nitride (SiNx), silicon oxide (SiOx), silicon oxynitride (SiON), or the like, and may be a single layer, a plurality of layers, or a composite layer. In an exemplary embodiment, the third insulating layer 14 is referred to as an interlayer insulating (ILD) layer.

(5) Forming Patterns of a Source Electrode and a Drain Electrode

Figure 7:
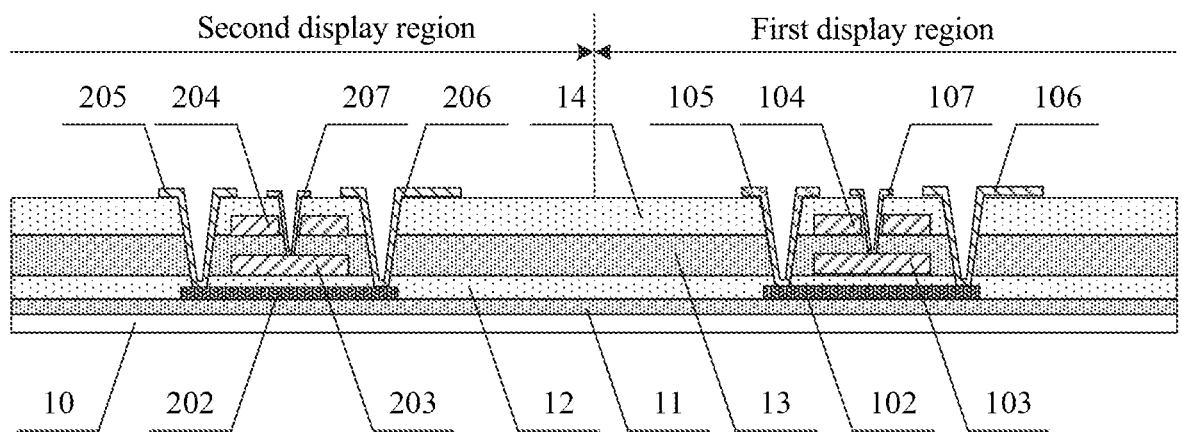
FIG. 7 is a schematic diagram of a display substrate after patterns of a source electrode and a drain electrode are formed according to an exemplary embodiment of the present disclosure.

In an exemplary embodiment, forming patterns of the source electrode and the drain electrode may include the following acts: a third metal thin film is deposited on the substrate 10 where the above structure is formed, the third metal thin film is patterned by a patterning process to form patterns of a first source electrode 105, a first drain electrode 106, and a first connection electrode 107 in the first display region, and form patterns of a second source electrode 205, a second drain electrode 206, and a second connection electrode 207 in the second display region, and form a pattern of a data line (not shown) in the entire display region, wherein the first source electrode 105 and the first drain electrode 106 are respectively connected with both ends of the first active layer 102 through two first vias K1, the first connection electrode 107 is connected with the first gate electrode 103 through a second via K2, and the first source electrode 105 is further connected with the data line; the second source electrode 205 and the second drain electrode 206 are respectively connected with both ends of the second active layer 202 through two first vias K1, the second connection electrode 207 is connected with the second gate electrode 203 through a second via K2, and the second source electrode 205 is further connected with a data line, as shown in FIG. 7. In an exemplary embodiment, the third metal thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be a multi-layer metal structure, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

(6) Forming a Pattern of a Fourth Insulating Layer

Figure 8:
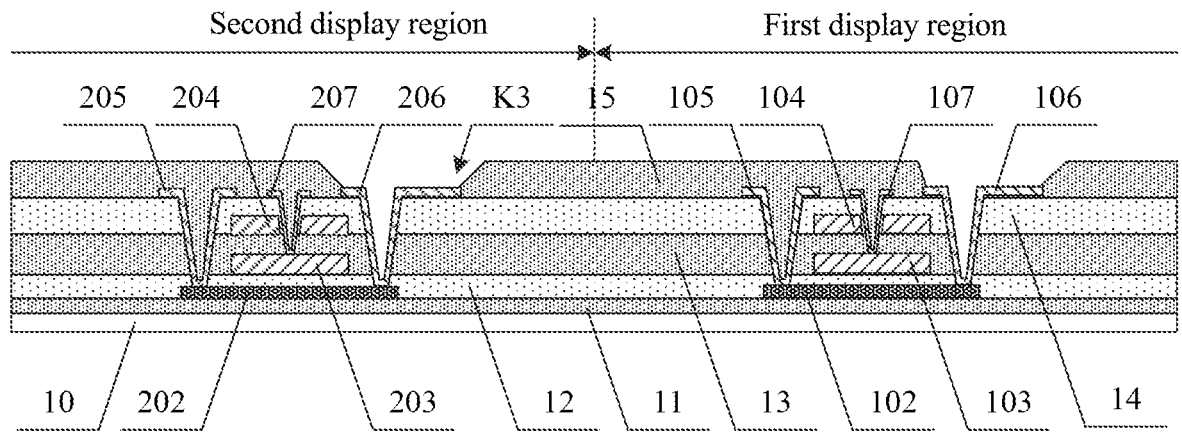
FIG. 8 is a schematic diagram of a display substrate after a pattern of a fourth insulating layer is formed according to an exemplary embodiment of the present disclosure.

In an exemplary embodiment, forming the pattern of the fourth insulating layer may include the following acts: a fourth insulating thin film is coated on the substrate where the above pattern is formed, the pattern of the fourth insulating layer 15 covering the above structure is formed in the display region through photolithography processes of mask exposure and development, wherein the fourth insulating layer 15 is provided with a third via K3 in each of the first display region and the second display region, and the third vias K3 expose the first drain electrode 106 and the second drain electrode 206, respectively, as shown in FIG. 8. In an exemplary embodiment, a material of the fourth insulating thin film includes, but is not limited to, polysiloxane-based materials, acrylic-based materials, polyimide-based materials, or the like. In an exemplary embodiment, the fourth insulating layer 15 is referred to as a planarization layer (PNL).

Through the preparation processes of the acts (1) to (6), the synchronous preparation of the first driving structure layer in the first display region and the second driving structure layer in the second display region on the substrate 10 is completed. In an exemplary embodiment, the first thin film transistor T1 of the first driving structure layer in the first display region includes the first active layer 102, the first gate electrode 103, the first capacitor electrode 104, the first source electrode 105, the first drain electrode 106, and the first connection electrode 107. The second thin film transistor T2 of the second driving structure layer in the second display region includes the second active layer 202, the second gate electrode 203, the second capacitor electrode 204, the second source electrode 205, the second drain electrode 206, and the second connection electrode 207. The first thin film transistor T1 and the second thin film transistor T2 have the same structure and are formed synchronously through a preparation process. That is, the first active layer 102 and the second active layer 202 are arranged on the same layer, and are formed simultaneously through the same patterning process; the first gate electrode 103 and the second gate electrode 203 are arranged on the same layer, and are formed simultaneously through the same patterning process; the first capacitor electrode 104 and the second capacitor electrode 204 are arranged on the same layer, and are formed simultaneously through the same patterning process; the first source electrode 105, the first drain electrode 106, and the first connection electrode 107 are arranged on the same layer as the second source electrode 205, the second drain electrode 206, and the second connection electrode 207, and are simultaneously formed by the same patterning process as the second source electrode 205, the second drain electrode 206, and the second connection electrode 207. In an exemplary embodiment, a plurality of gate lines and a plurality of data lines may be further formed in the first display region and the second display region, and the plurality of gate lines and the plurality of data lines vertically intersect to define a plurality of display units. In the first display region, the display units are emitting units. In the second display region, the display units are electrophoretic units. The emitting units and the electrophoretic units in the same row share the same gate line, and the emitting units and the electrophoretic units in the same column share the same data line.

(7) Forming a Pattern of an Anode

Figure 9:
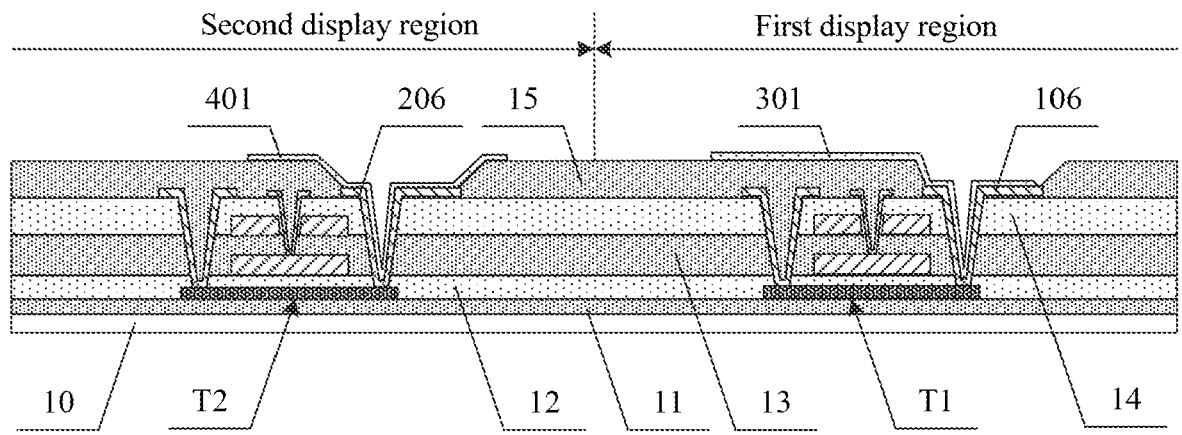
FIG. 9 is a schematic diagram of a display substrate after a pattern of an anode is formed according to an exemplary embodiment of the present disclosure.

In an exemplary embodiment, forming the pattern of the anode may include the following acts: a transparent conductive thin film is deposited on a substrate where the above pattern is formed, the transparent conductive thin film is patterned through a patterning process to form patterns of a first anode 301 and a second anode 401, wherein the first anode 301 is in the first display region, and is connected with the first drain electrode 106 through a third via K3 of the first display region, the second anode 401 is in the second display region, and is connected with the second drain electrode 206 through a third via K3 of the second display region, as shown in FIG. 9. In an exemplary embodiment, the transparent conductive thin film may be made of indium tin oxide (ITO) or indium zinc oxide (IZO).

(8) Forming a Pattern of a Pixel Defining Layer

Figure 10:
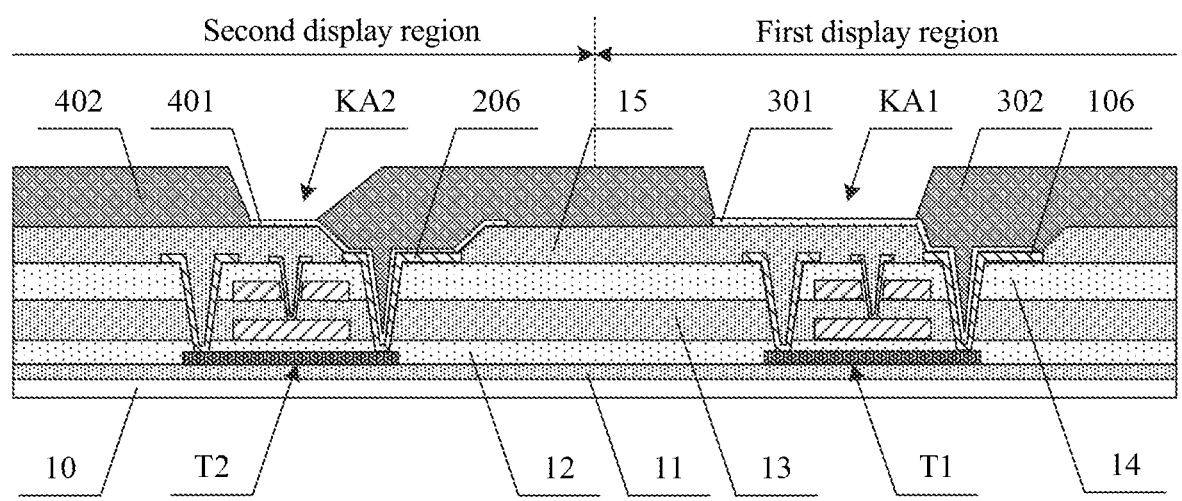
FIG. 10 is a schematic diagram of a display substrate after a pattern of a pixel defining layer is formed according to an exemplary embodiment of the present disclosure.

In an exemplary embodiment, forming the pattern of the pixel defining layer may include the following acts: a pixel definition thin film is coated on a substrate where the above pattern is formed, and patterns of a first pixel defining layer 302 and a second pixel defining layer 402 are formed through mask exposure and development, wherein the first pixel defining layer 302 is in the first display region and defines an opening region KA1 exposing the first anode 301, and the second pixel defining layer 402 is in the second display region and is provided with a groove KA2, as shown in FIG. 10. In an exemplary embodiment, a structure and shape of the opening region KA1 of the first pixel defining layer 302 may be the same as those of an existing OLED, a cross-sectional shape of the groove KA2 of the second pixel defining layer 402 is an inverted trapezoid shape, and a width of a near end of the groove KA2 close to the second anode 401 is smaller than a width of a remote end of the groove KA2 away from the second anode 401. In an exemplary embodiment, a depth of the groove KA2 may be equal to a thickness of the second pixel defining layer 402, i.e., a bottom of the groove KA2 exposes a surface of the second anode. In some possible implementations, the depth of the groove KA2 may be smaller than the thickness of the second pixel defining layer 402, that is, the groove KA2 does not penetrate the second pixel defining layer 402, the groove KA2 does not expose the surface of the second anode, and the bottom of the groove KA2 is spaced apart from the second anode by a second pixel defining layer with a certain thickness. In an exemplary embodiment, the pixel definition thin film may be made of a transparent organic material. In some possible implementations, the first pixel defining layer 302 and the second pixel defining layer 402 may be formed separately, a material of the first pixel defining layer 302 is a material commonly used for the OLED, and a material of the second pixel defining layer 402 is a transparent resin material. In an exemplary embodiment, the second pixel defining layer 402 is referred to as a Partition Wall. Although not shown in the drawings, the first pixel defining layers 302 and the second pixel defining layers 402 are arranged in a matrix on the substrate 10, an opening region is formed in each emitting unit, and a groove is formed in each electrophoretic unit.

(9) Forming a Pattern of an Organic Emitting Material Layer

Figure 11:
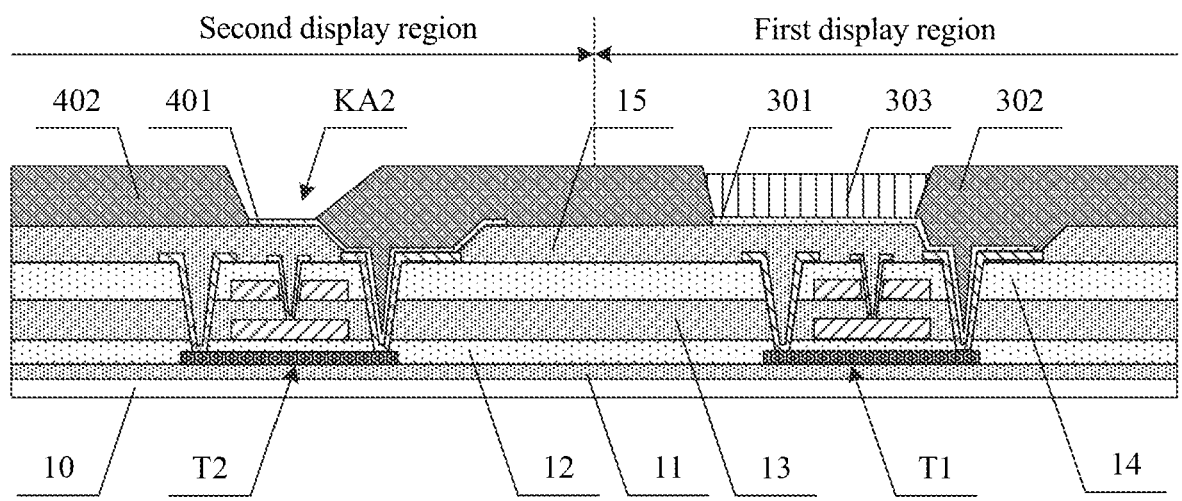
FIG. 11 is a schematic diagram of a display substrate after a pattern of an organic emitting material layer is formed according to an exemplary embodiment of the present disclosure.

In an exemplary embodiment, forming the pattern of the organic emitting material layer may include the following acts: the pattern of the organic emitting material layer 303 is formed by evaporation or ink-jet printing in each opening region KM formed in the first display region on the substrate where the above pattern is formed, wherein the organic emitting material layer 303 is connected with the first anode 301, as shown in FIG. 11. In an exemplary embodiment, the organic emitting material layer 303 may include an emitting material layer (EML). In some possible implementations, the organic emitting material layer may include a hole injection layer, a hole transporting layer, an emitting material layer, an electron transporting layer, and an electron injection layer arranged sequentially, which may improve the efficiency of injecting electrons and holes into the emitting layer.

(10) Forming a Pattern of an Electrophoretic Display Material Layer

Figure 12:
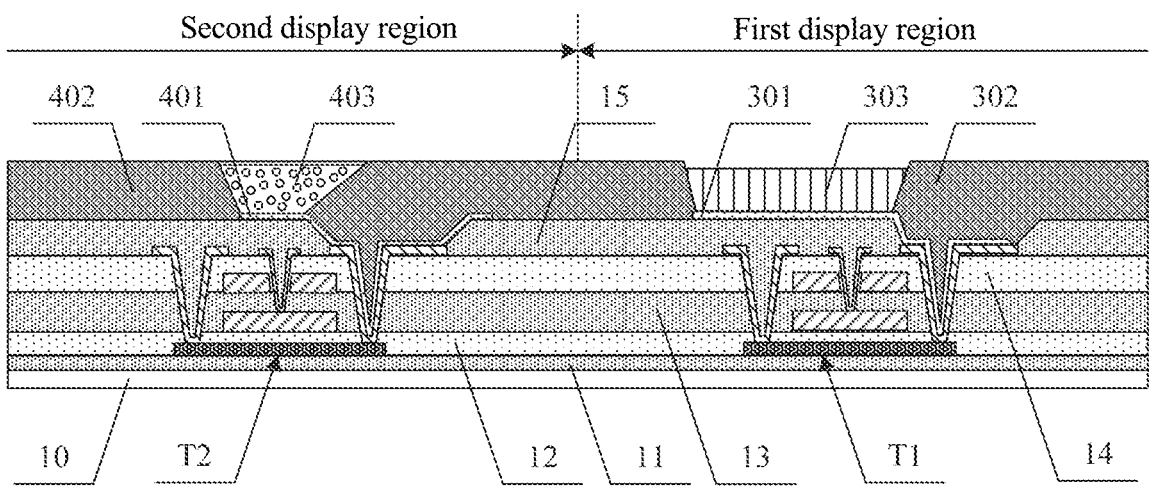
FIG. 12 is a schematic diagram of a display substrate after a pattern of an electrophoretic display material layer is formed according to an exemplary embodiment of the present disclosure.

In an exemplary embodiment, forming the pattern of the electrophoretic display material layer may include the following acts: electrophoretic liquid is injected, by ink-jet printing, into each groove KA2 formed in the second display region on the substrate, where the above pattern is formed, to form the pattern of the electrophoretic display material layer 403, as shown in FIG. 12. In an exemplary embodiment, the electrophoretic display material layer 403 may include a transparent dispersion, dyed conductive particles, and a transparent sealing layer.

(11) Forming a Pattern of a Cathode

Figure 13:
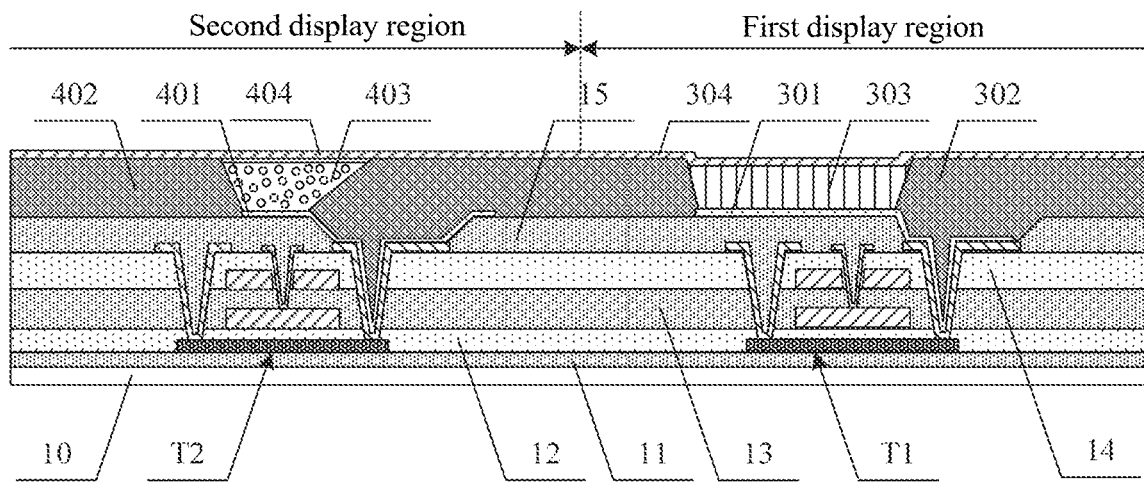
FIG. 13 is a schematic diagram of a display substrate after a pattern of a cathode is formed according to an exemplary embodiment of the present disclosure.

In an exemplary embodiment, forming the pattern of the cathode may include the following acts: patterns of a first cathode 304 and a second cathode 404 are formed, by evaporation, on the substrate where the aforementioned pattern is formed. The first cathode 304 is in the first display region, and is connected with the organic emitting material layer 303. The second cathode 404 is in the second display region, and is connected with the electrophoretic display material layer 403, as shown in FIG. 13. In an exemplary embodiment, the first cathode 304 and the second cathode 404 may be in an integral structure. In some possible implementations, the first cathode 304 and the second cathode 404 may be separate structures, and the first cathode 304 and the second cathode 404 may provide different voltages. In an exemplary embodiment, the materials of the first cathode 304 and the second cathode 404 may be one of metal materials such as magnesium (Mg), argentum (Ag), aluminum (Al), copper (Cu), lithium (Li), or an alloy of the above metals.

(12) Forming a Pattern of an Encapsulation Layer

Figure 14:
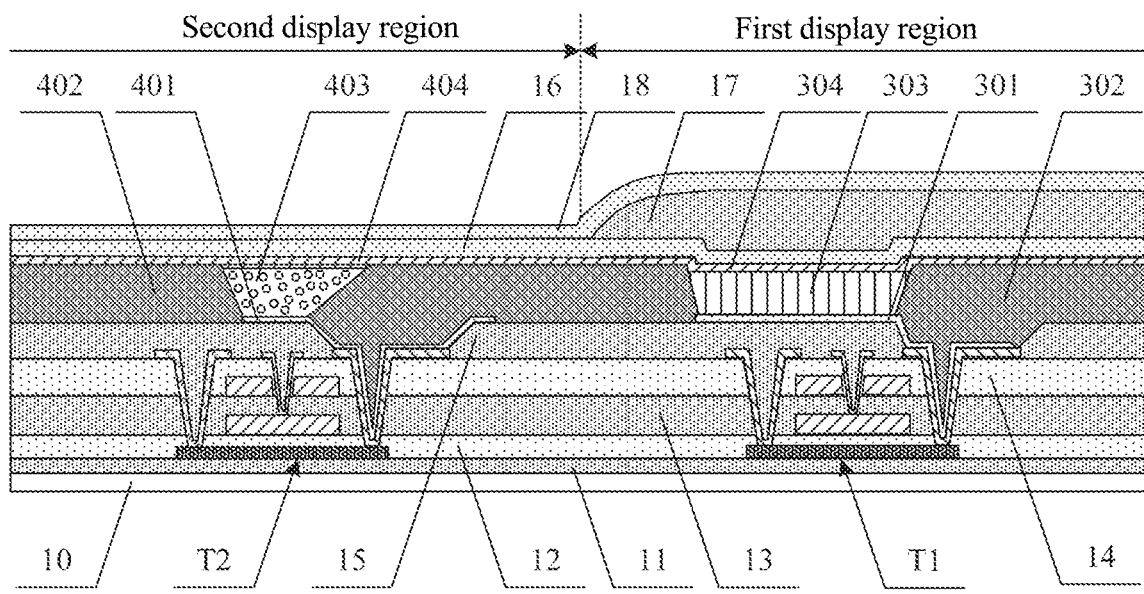
FIG. 14 is a schematic diagram of a display substrate after a pattern of an encapsulation layer is formed according to an exemplary embodiment of the present disclosure.

In an exemplary embodiment, forming the pattern of the encapsulation layer may include the following acts: a first inorganic thin film is first deposited on the substrate where the above pattern is formed, and the first inorganic thin film covers the first display region and the second display region to form a pattern of a first inorganic layer 16. Next, an organic layer 17 is formed in the first display region by ink-jet printing. Subsequently, a second inorganic thin film is deposited, and the second inorganic thin film covers the first display region and the second display region to form a pattern of a second inorganic layer 18, as shown in FIG. 14. In an exemplary embodiment, the encapsulation layer may have an inorganic/organic/inorganic three-layer structure, an intermediate organic layer is formed only in the first display region, and the upper and lower inorganic layers cover the first display region and the second display region, to complete encapsulation of the display substrate.

Through the preparation processes of the acts (7) to (12), the preparation of the emitting structure layer in the first display region and the electrophoretic structure layer in the second display region is completed. In an exemplary embodiment, the emitting structure layer in the first display region includes the first anode 301, the first pixel defining layer 302, the organic emitting material layer 303, the first cathode 304, and the encapsulation layer. The first anode 301 is connected with the drain electrode of the first transistor T1, the organic emitting material layer 303 is arranged between the first anode 301 and the first cathode 304, and the first cathode 304 and the second cathode 404 of the second display region are integrated. The electrophoretic structure layer in the second display region includes the second anode 401, the second pixel defining layer 402, the electrophoretic display material layer 403, the second cathode 404, and the encapsulation layer. The second anode 401 is connected with the drain electrode of the second transistor T2, the electrophoretic display material layer 403 is arranged between the second anode 401 and the second cathode 404, and the second cathode 404 and the first cathode 304 of the first display region are integrated. The emitting structure layer and the electrophoretic structure layer are formed synchronously through a preparation process, namely, the first anode 301 and the second anode 401 are arranged on the same layer and formed simultaneously through the same patterning process. The first pixel defining layer 302 and the second pixel defining layer 402 are arranged on the same layer and formed simultaneously through the same patterning process, and the first cathode 304 and the second cathode 404 are arranged on the same layer and formed simultaneously through the same patterning process.

Figure 15:
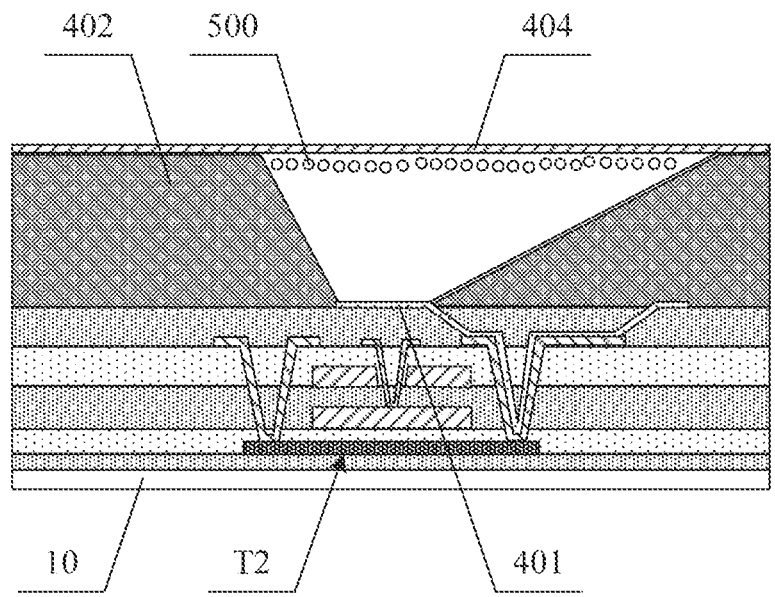
FIG. 15 is a schematic diagram of an electrophoretic unit in a display state according to an exemplary embodiment of the present disclosure.
Figure 16:
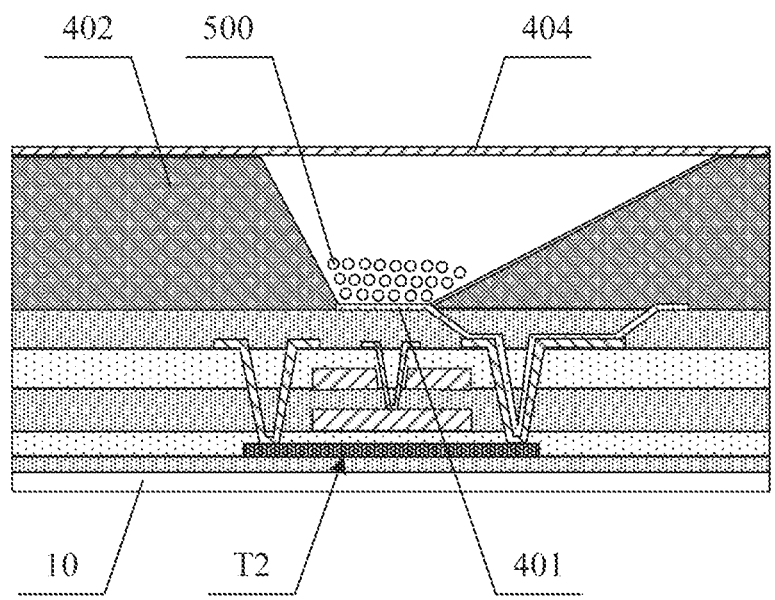
FIG. 16 is a schematic diagram of an electrophoretic unit in a transparent state according to an exemplary embodiment of the present disclosure.

FIG. 15 is a schematic diagram of an electrophoretic unit in a display state according to an exemplary embodiment of the present disclosure, and FIG. 16 is a schematic diagram of an electrophoretic unit in a transparent state according to an exemplary embodiment of the present disclosure. When the electrophoretic unit is in the display state, a gate line turn-on signal enables the second transistor T2 to be turned on, and a data voltage of the data line is applied to the second anode 401 through the second transistor T2. An electric field generated between the second anode 401 and the second cathode 404 enables the dyed conductive particles 500 to move toward a side away from the second anode 401, and the top of the groove is covered by the dyed conductive particles 500, enabling the electrophoretic unit to display images, as shown in FIG. 15. When the electrophoretic unit is in the transparent state, a gate line turn-on signal enables the second transistor T2 to be turned on, and a data voltage of the data line is applied to the second anode 401 through the second transistor T2. An electric field generated between the second anode 401 and the second cathode 404 enables the dyed conductive particles 500 to move toward a side close to the second anode 401 and to gather at the bottom of the groove, enabling the electrophoretic unit to form local transparency, as shown in FIG. 16.

In the following, two states of the electrophoretic unit will be exemplified in an example where the dyed conductive particles are white particles. In an exemplary embodiment, the dispersion is a transparent liquid, the sealing layer is a transparent material layer, the second cathode 404 has a negative (−) potential, and the white particles have a positive (+) charge characteristic. In an exemplary embodiment, when a positive (+) voltage provided by the data line is applied to the second anode 401 through the second transistor T2, since the second cathode 404 has the negative (−) potential, the white particles with positive (+) charges move toward a side of the second cathode 404, and finally the top of the groove with a shape of an inverted frustum of a cone or an inverted frustum of a prism is covered by the white particles. Most of the light incident from outside (an upper part) is reflected by white particles, electrophoretic units display images, and a plurality of electrophoretic units form a weak display region. In an exemplary embodiment, a density of the white particles on the top of the groove with a shape of an inverted frustum of a cone or an inverted frustum of a prism varies according to a voltage value applied to the second anode 401, so intensity of the light reflected by the white particles also varies, and ideal brightness can be realized. In an exemplary embodiment, when the negative (−) voltage provided by the data line is lower than the negative (−) potential of the second cathode 404, the white particles with positive (+) charge move toward a side of the second anode 401, finally the white particles gather at the bottom of the groove with a shape of an inverted frustum of a cone or an inverted frustum of a prism. Most of the light incident from the outside (an upper part) passes through transparent dispersion and other structural layers, and the incident light is not reflected, so that electrophoretic units can realize local transparency, and a plurality of electrophoretic units form a local transparent region.

In an exemplary embodiment, when the dyed conductive particles are black particles, it can be realized that the electrophoretic unit has two states of display and transparency. In an exemplary embodiment, three electrophoretic units may be arranged to form one pixel, and color particles, such as red (R) particles, green (G) particles and blue (B) particles, are respectively arranged in the three electrophoretic units, and distribution densities of the color particles in the three electrophoretic units vary according to the voltage applied to the second anode 401 to realize corresponding color display.

According to the exemplary embodiment of the present disclosure, the first display region and the second display region are synchronously prepared on a shared substrate, OLED display and EPD display are well integrated on one display substrate, OLED in the first display region is taken as main display, EPD in the second display region is taken as auxiliary display, and the characteristic that the electrophoretic units can be switched between the display state and the transparent state is utilized, so that not only a full screen is realized, but also the normal work of hardware such as a camera can be ensured. When the electrophoretic units are switched to the display state, the electrophoretic units and the emitting units provide image display together to realize a truly full screen. When the electrophoretic units are switched to the transparent state, the transparent region formed by the electrophoretic units can provide a working window for hardware such as a camera and ensure the normal work of the hardware such as the camera. In an exemplary embodiment, the second display region is equivalent to an opening region, and hardware such as a camera and an optical sensor is arranged under the second display region. When hardware such as the camera does not work, the second display region realizes image display, and when hardware such as the camera works, the second display region realizes local transparency. Compared with the existing art, in an exemplary embodiment of the present disclosure, the opening region is arranged as electrophoretic units, and when the electrophoretic units are switched to the display state, images can be displayed in the opening region, thus truly realizing full screen display; and when the electrophoretic units are switched to the transparent state, the normal working of hardware such as a camera is not affected, realizing truly full screen display.

For a solution of opening a mounting hole in the display region of an OLED display screen, one of the difficulties lies in effectiveness of encapsulation. As side walls of the mounting hole expose the organic emitting layer and the cathode, water and oxygen in the atmosphere can invade an active display region along the organic emitting layer, so that the organic emitting layer in the active display region fails, resulting in defects in display. According to the exemplary embodiment of the present disclosure, the electrophoretic units are arranged, and the encapsulation layer encapsulates the emitting units and the electrophoretic units together, so that not only the design difficulty and the manufacturing cost are reduced, but also a transmission path of water and oxygen for invading the organic emitting layer is eliminated, the encapsulation effect is improved, and the effectiveness and reliability of encapsulation are ensured.

According to the exemplary embodiment of the present disclosure, OLED display and EPD display are synchronously prepared on the substrate through the same preparation process, so that the display the integration level is high and the structure of the display substrate is simplified, beneficial to the thinning, the process improvement is small, the process compatibility is good, the process realizability is high, and the practicability is strong.

The structure and preparation process of the display substrate shown in an exemplary embodiment of the present disclosure are merely illustrative. In some possible embodiments, according to actual needs corresponding structures may be changed and patterning processes may be added or reduced. In some possible implementations, the OLED structure of the first display region may be a top emission structure or a bottom emission structure. In some possible implementations, the thin film transistor may be a top gate structure or a bottom gate structure. In some possible implementations, other electrodes, leads, and structural film layers may be provided in the first driving structure layer, the second driving structure layer, the emitting structure layer, and the electrophoretic display layer. In some possible implementations, a sequence of forming the organic emitting material layer and forming the electrophoretic display material layer may be changed, etc., and the present disclosure is not limited herein.

In an exemplary embodiment, another method may be used to form the organic emitting layer and the electrophoretic display layer, including the following operation acts.

(8) Forming a Pattern of a First Pixel Defining Layer

Figure 17:
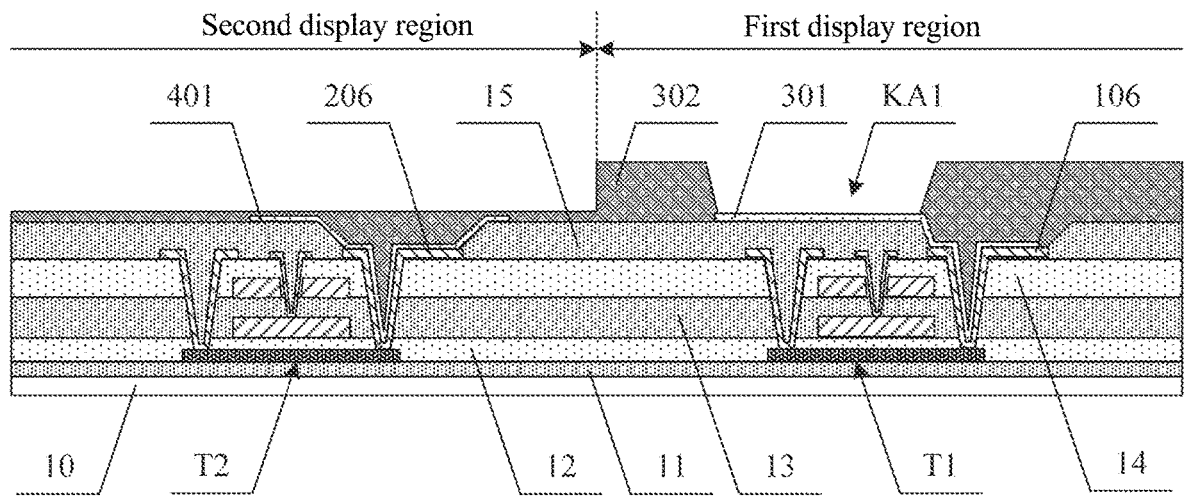
FIG. 17 is a schematic diagram of a display substrate after a pattern of a first pixel defining layer is formed according to an exemplary embodiment of the present disclosure.

In an exemplary embodiment, the first pixel defining layer 302 in the first display region defines an opening region KA1 exposing the first anode 301, and the first pixel defining layer 302 in the second display region covers the second anode 401, as shown in FIG. 17.

(9) Forming a Pattern of an Organic Emitting Material Layer

Figure 18:
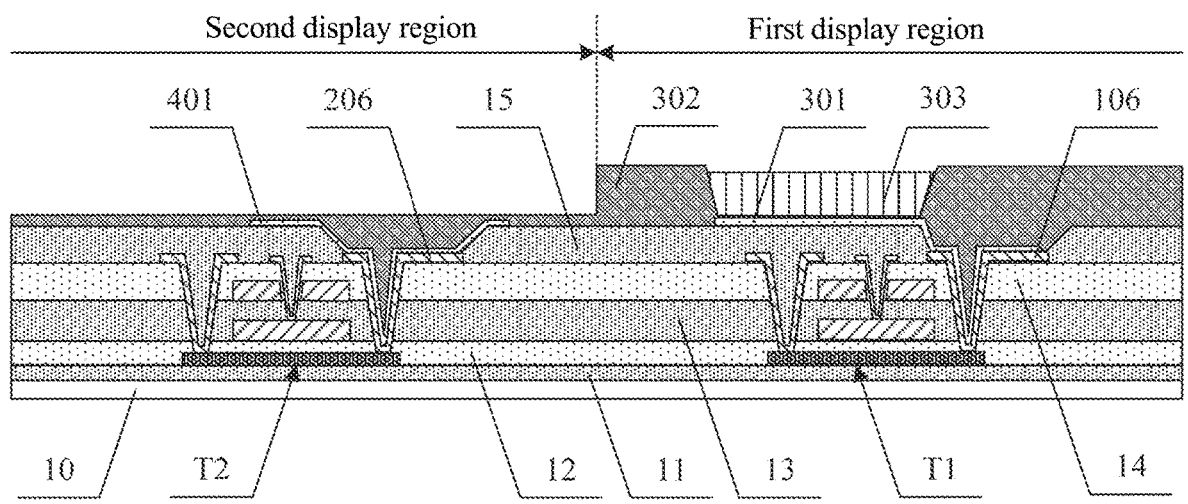
FIG. 18 is a schematic diagram of a display substrate after a pattern of an organic emitting material layer is formed according to an exemplary embodiment of the present disclosure.

In an exemplary embodiment, forming the pattern of the organic emitting material layer may include the following acts: the pattern of the organic emitting material layer 303 is formed in each opening region KA1 formed in the first display region by evaporation or ink-jet printing, and the organic emitting material layer 303 is connected with the first anode 301, as shown in FIG. 18.

(10) Pasting an Electrophoretic DiSplay Layer

Figure 19:
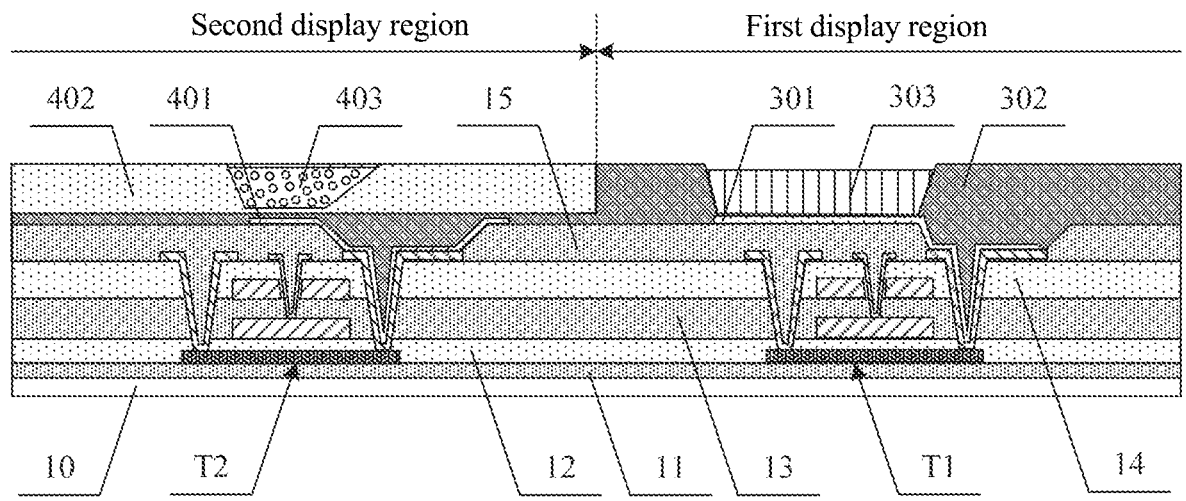
FIG. 19 is a schematic diagram of a display substrate after an electrophoretic display layer is pasted according to an exemplary embodiment of the present disclosure.

In an exemplary embodiment, pasting the electrophoretic display layer may include the following acts: the electrophoretic display layer pre-prepared is pasted on the second display region, as shown in FIG. 19. In an exemplary embodiment, the electrophoretic display layer pre-prepared may include a second pixel defining layer 402 formed with a groove, the depth of which is smaller than the thickness of the second pixel defining layer 402, and an electrophoretic display material layer 403 arranged within the groove.

The present disclosure further provides a preparation method of the display substrate to prepare the display substrate. The display substrate includes a first display region and a second display region within the first display region. In an exemplary embodiment, the preparation method may include: forming a plurality of emitting units in the first display region, and forming a plurality of electrophoretic units in the second display region, wherein the plurality of emitting units are configured to realize display, and the plurality of electrophoretic units are configured to realize switch between a display state and a transparent state.

In an exemplary embodiment, forming the plurality of emitting units in the first display region and forming the plurality of electrophoretic units in the second display region may include: forming synchronously first driving structure layers and second driving structure layers on a substrate; and forming synchronously emitting structure layers and electrophoretic structure layers.

Each emitting structure layer is formed on each first driving structure layer, and the each first driving structure layer and the each emitting structure layer form an emitting unit realizing display; and each electrophoretic structure layer is formed on each second driving structure layer, and the each second driving structure layer and the each electrophoretic structure layer form an electrophoretic unit realizing switching between the display state and the transparent state.

In an exemplary embodiment, forming synchronously the first driving structure layers and the second driving structure layers on the substrate may include: forming first active layers and second active layers on the substrate, wherein the first active layers are in the first display region and the second active layers are in the second display region; forming a first insulating layer, and forming first gate electrodes and second gate electrodes on the first insulating layer, wherein the first gate electrodes are in the first display region and the second gate electrodes are in the second display region; forming a second insulating layer and a third insulating layer, wherein first vias exposing each first active layer and each second active layer respectively and second vias exposing each first gate electrode and each second gate electrode respectively are formed on the third insulating layer; forming first source electrodes, first drain electrodes, first connection electrodes, second source electrodes, second drain electrodes and second connection electrodes on the third insulating layer, wherein each first source electrode and each first drain electrode are respectively connected with a first active layer through first vias, each first connection electrode is connected with a first gate electrode through a second via, each second source electrode and each second drain electrode are respectively connected with a second active layer through first vias, and each second connection electrode is connected with each second gate electrode through a second via; and forming a fourth insulating layer, wherein third vias exposing the first drain electrodes and the second drain electrodes respectively are formed on the fourth insulating layer.

In an exemplary embodiment, forming synchronously the emitting structure layers and the electrophoretic structure layers may include: forming first anodes and second anodes on the fourth insulating layer, wherein each first anode and each second anode are respectively connected with a first drain electrode and a second drain electrode through third vias; forming organic emitting layers in the first display region, and forming electrophoretic display layers in the second display region; and forming first cathodes and second cathodes, wherein the first cathodes are in the first display region and the second cathodes are in the second display region.

In an exemplary embodiment, forming the organic emitting layers in the first display region, and forming the electrophoretic display layers in the second display region may include: forming first pixel defining layers and second pixel defining layers, wherein the first pixel defining layers are in the first display region, opening regions exposing the first anodes are formed on the first pixel defining layers, the second pixel defining layers are in the second display region, and grooves are formed on the second pixel defining layers; and forming organic emitting material layers within the opening regions; and forming the electrophoretic display material layers within the grooves.

In another exemplary embodiment, forming the organic emitting layers in the first display region, and forming the electrophoretic display layers in the second display region may include: forming first pixel defining layers in the first display region, wherein opening regions exposing the first anodes are formed on the first pixel defining layers; forming organic emitting material layers are formed in the opening regions; and pasting pre-prepared electrophoretic display layers on the second display region, wherein the electrophoretic display layers include second pixel defining layers formed with grooves, and electrophoretic display material layers arranged within the grooves.

In an exemplary embodiment, a cross-sectional shape of a groove is an inverted trapezoid shape, and a width of a near end of the groove close to a second anode is smaller than a width of a remote end of the groove away from the second anode.

In an exemplary embodiment, an electrophoretic display material layer includes a transparent dispersion and dyed conductive particles arranged in the dispersion.

In an exemplary embodiment, a depth of the groove is less than or equal to a thickness of the second pixel defining layer.

According to the exemplary embodiment of the present disclosure, organic light emitting display and electrophoretic display are well integrated, and the characteristic that the electrophoretic units can be switched between the display state and the transparent state is utilized, so that not only a full screen is realized, but also the normal work of hardware such as a camera can be ensured, realizing the truly full screen display. According to the exemplary embodiment of the present disclosure, OLED display and EPD display are synchronously prepared on the substrate through the same preparation process, the process improvement is small, the process compatibility is good, the process realizability is high, and the practicability is strong.

The present disclosure further provides a display apparatus including any one of the display substrates in aforementioned embodiments. The display apparatus may include a front-mounted camera, an optical sensor or other devices, and the arranged positions of the front-mounted camera, the optical sensor and other devices correspond to the second display region of the display substrate, i.e., are arranged under the second display region, so that the switching between transparency and display can be realized in a region corresponding to the camera. During normal display, the electrophoretic units in the second display region are switched to the display state, and provide image display together with the emitting units in the first display region, realizing a truly full screen. When the display apparatus is used for self-photographing or the front-mounted optical sensor of the display apparatus is started, the electrophoretic units in the second display region are switched to the transparent state, so that the front-mounted camera or the front-mounted optical sensor under the second display region can normally work. The display apparatus may be any product or component with a display function such as a mobile phone, a tablet computer, a television, a display, a notebook computer, a digital photo frame, a navigator, etc.

In the description of the present disclosure, it should be understood that the azimuth or position relationship indicated by the terms "middle", "upper", "lower", "front", "rear", "vertical", "horizontal", "top", "bottom", "inner", "outer" and the like is based on the azimuth or position relationship shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of the present disclosure, it should be noted that, unless otherwise clearly specified or defined, the term "install", "connect" or "link" should be broadly interpreted, for example, it may be fixed connection, detachable connection, or integral connection; it may be a mechanical connection or an electrical connection; and it may be direct connection, indirect connection through an intermediary, or an internal connection between two elements. Those of ordinary skills in the art can understand the specific meanings of the above terms in the present disclosure according to specific situations.

Although the embodiments disclosed in the present disclosure are as the above, the contents are only embodiments for facilitating understanding the present application and are not used to limit the present disclosure. Any person skilled in the art to which the present disclosure pertains can make any modifications and variations in the form and details of implementation without departing from the spirit and scope of the present disclosure. Nevertheless, the scope of patent protection of the present application shall still be determined by the scope as defined in the appended claims.

What we claim is:

1. A display substrate, comprising a first display region and a second display region within the first display region, wherein the first display region comprises a plurality of emitting units, the second display region comprises a plurality of electrophoretic units, the plurality of emitting units are configured to realize display, and the plurality of electrophoretic units are configured to realize switch between a display state and a transparent state.

2. The display substrate according to claim 1, wherein each of the plurality of emitting units comprises a first driving structure layer and an emitting structure layer which are stacked on a substrate, and each of the plurality of electrophoretic units comprises a second driving structure layer and an electrophoretic structure layer which are stacked on the substrate.

3. The display substrate according to claim 2, wherein the first driving structure layer comprises a plurality of first thin film transistors, each of the plurality of first thin film transistors comprises a first active layer, a first gate electrode, a first source electrode and a first drain electrode; the second driving structure layer comprises a plurality of second thin film transistors, each of the plurality of second thin film transistors comprises a second active layer, a second gate electrode, a second source electrode, and a second drain electrode; the first active layer and the second active layer are arranged on a same layer; the first gate electrode and the second gate electrode are arranged on a same layer; and the first source electrode, the first drain electrode, the second source electrode and the second drain electrode are arranged on a same layer.

4. The display substrate according to claim 2, wherein the emitting structure layer comprises a first anode, an organic emitting layer, and a first cathode; the electrophoretic structure layer comprises a second anode, an electrophoretic display layer and a second cathode; the first anode and the second anode are arranged on a same layer; and the first cathode and the second cathode are arranged on a same layer.

5. The display substrate according to claim 4, wherein the organic emitting layer comprises a first pixel defining layer provided with an opening region, and an organic emitting material layer arranged within the opening region; and the electrophoretic display layer comprises a second pixel defining layer provided with a groove, and an electrophoretic display material layer arranged within the groove.

6. The display substrate according to claim 5, wherein the electrophoretic display material layer comprises a transparent dispersion and dyed conductive particles arranged in the dispersion.

7. The display substrate according to claim 5, wherein the first pixel defining layer and the second pixel defining layer are arranged on a same layer.

8. The display substrate according to claim 5, wherein a cross-sectional shape of the groove is an inverted trapezoid shape, and a width of a near end of the groove close to the second anode is smaller than a width of a remote end of the groove away from the second anode.

9. The display substrate according to claim 5, wherein a depth of the groove is less than or equal to a thickness of the second pixel defining layer.

10. A display apparatus, comprising the display substrate according to claim 1.

* * * * *